(12) United States Patent
Tran

(10) Patent No.: US 12,174,600 B1
(45) Date of Patent: Dec. 24, 2024

(54) POWER BUS BAR AND SWIVELABLE USER INTERFACE FOR SPA CONTROL SYSTEM

(71) Applicant: Trong Huu Tran, Fountain Valley, CA (US)

(72) Inventor: Trong Huu Tran, Fountain Valley, CA (US)

(*) Notice: Subject to any disclaimer, the term of this patent is extended or adjusted under 35 U.S.C. 154(b) by 1236 days.

(21) Appl. No.: 16/849,835

(22) Filed: Apr. 15, 2020

Related U.S. Application Data

(60) Provisional application No. 62/834,905, filed on Apr. 16, 2019.

(51) Int. Cl.
| | | |
|---|---|---|
| *G05B 15/02* | (2006.01) | |
| *A61H 33/00* | (2006.01) | |
| *H05K 1/14* | (2006.01) | |

(52) U.S. Cl.
CPC ........... *G05B 15/02* (2013.01); *A61H 33/005* (2013.01); *A61H 2201/5043* (2013.01); *H05K 1/14* (2013.01)

(58) Field of Classification Search
CPC ........ H05K 2201/10272; A61H 33/005; H01R 4/34
See application file for complete search history.

(56) References Cited

U.S. PATENT DOCUMENTS

| | | | | | |
|---|---|---|---|---|---|
| 2,920,305 | A | * | 1/1960 | Gibson | H01R 4/36 439/814 |
| 3,638,173 | A | * | 1/1972 | Middendorf | H01R 4/36 439/814 |
| 3,727,171 | A | * | 4/1973 | Coles | H01R 4/34 439/810 |
| 4,015,184 | A | * | 3/1977 | Cooperman | H02M 7/08 363/141 |
| 5,244,423 | A | * | 9/1993 | Erickson | H02G 5/02 439/810 |
| 6,024,589 | A | * | 2/2000 | Hahn, IV | H05K 1/148 439/212 |
| 2011/0221268 | A1 | * | 9/2011 | Kanazawa | H05K 1/0263 307/10.1 |
| 2015/0236607 | A1 | * | 8/2015 | Zhao | H02M 7/537 361/752 |
| 2016/0306482 | A1 | * | 10/2016 | Gmyr | G09G 3/3406 |

(Continued)

*Primary Examiner* — Paresh Paghadal
(74) *Attorney, Agent, or Firm* — Stout, Uxa & Buyan, LLP; Donald E. Stout

(57) ABSTRACT

A modular spa control system includes a first printed circuit board (PCB) and a second PCB. A bus bar, formed of a conductive material and being secured to each of the first PCB and the second PCB, creates an electrically conductive path along a length of the bus bar between the first PCB and the second PCB. A user interface has a housing formed of a bottom housing portion and a top housing portion. At least one of the first PCB and the second PCB is disposed in the housing, and a display is disposed on a top surface of the top housing portion. Controls are also disposed on the top surface of the top housing portion, in proximity to the display. An interface is mountable within a wall shell of a spa unit, so that the display and the controls are disposed on a top portion of the spa wall. Additionally, a pivot member is rotatably supported within the wall shell and configured to support the top housing portion so that it may be swiveled between upright vertical or side orientations.

6 Claims, 6 Drawing Sheets

(56) References Cited

U.S. PATENT DOCUMENTS

| | | | |
|---|---|---|---|
| 2021/0104870 A1* | 4/2021 | Sato | H01S 5/18305 |
| 2023/0327462 A1* | 10/2023 | Friedrich | B60L 58/19 320/109 |

* cited by examiner

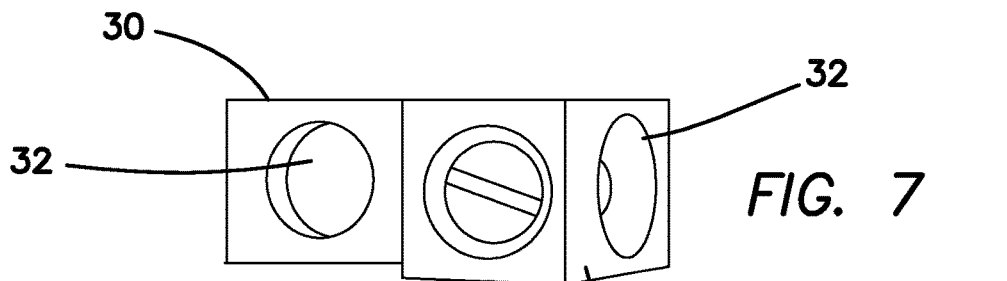
FIG. 7
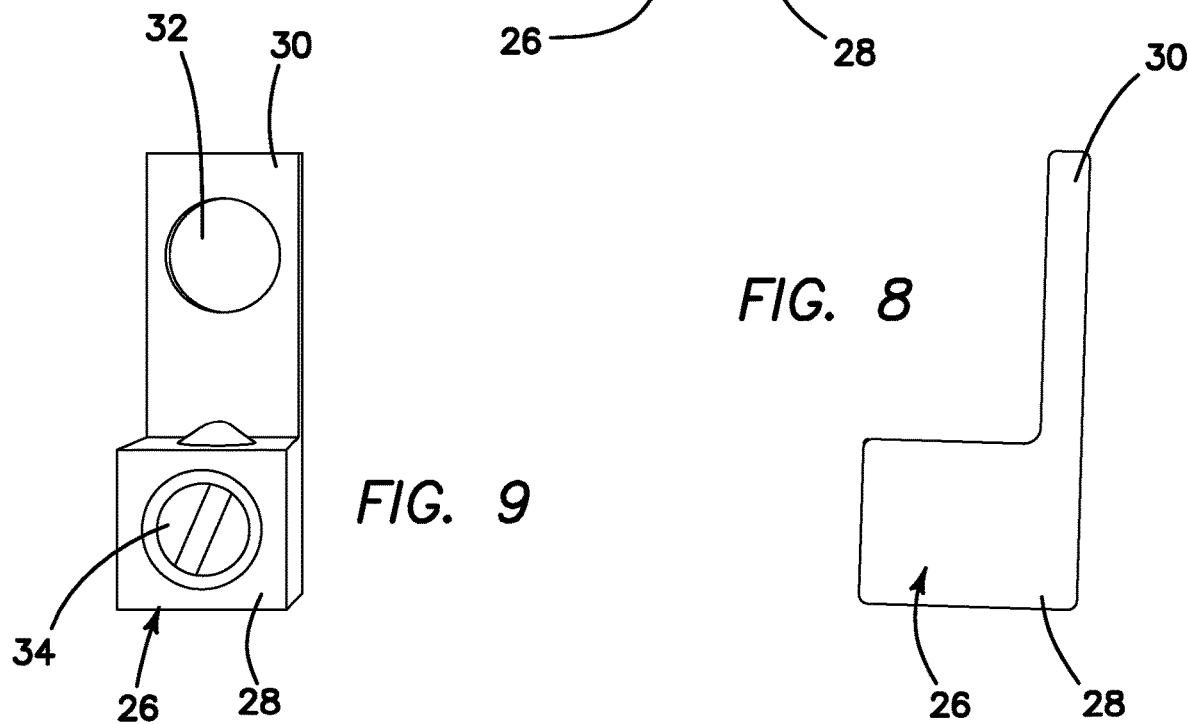
FIG. 8
FIG. 9
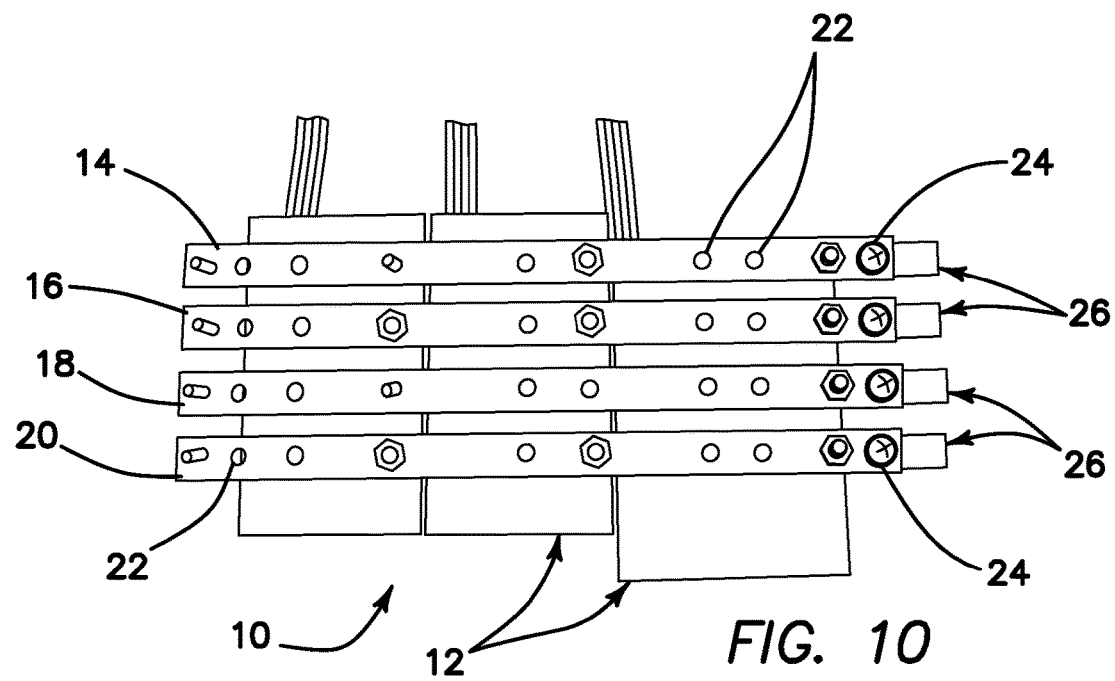
FIG. 10

POWER BUS BAR AND SWIVELABLE USER INTERFACE FOR SPA CONTROL SYSTEM

This application claims the benefit under 35 U.S.C. 119 (e) of the filing date of Provisional U.S. Application Ser. No. 62/834,905, entitled Power Bus Bar and Swivelable User Interface for Spa Control System, filed on Apr. 16, 2019, which is expressly incorporated herein by reference, in its entirety.

BACKGROUND OF THE INVENTION

Spa control systems, of course, are well known in the art. A typical spa controller comprises one or more printed circuit boards (PCB's) on which are wired the electronic components necessary to enable a functioning spa system. The Ground, Line 1, Line 2 and Neutral lines are routed with the traces on the PCB. The power traces are often unable to rout the supplied power to the relay or output connectors, resulting in a need to add wires to the circuitry. As wires are added to each relay or output connector, the controller system becomes very messy.

Additionally, in current spa control systems, a common incoming power terminal block is used on the PCB to route Line power to the relay or connectors. This block can be expensive.

Current spa user interfaces, typically what is known as a topside panel, are mounted on the top ledge of the spa. When the user uses the spa, sitting inside the spa, he or she is unable to see the display on the user interface or to operate the control buttons, without standing and leaning over the spa ledge.

It would be advantageous to update and address each of the foregoing problems in a new inventive approach, as is described hereinbelow.

SUMMARY OF THE INVENTION

The present invention is a modular spa control system, which comprises a first printed circuit board (PCB) comprising circuitry and electronic components forming a part of the modular spa control system, a second PCB comprising circuitry and electronic components forming a different part of the modular spa control system, and a bus bar comprised of a conductive material and being secured to each of the first PCB and the second PCB to create an electrically conductive path along a length of the bus bar between the circuitry and electronic components of the first PCB and the circuitry and electronic components of the second PCB. Electrical power is supplied to each of the first PCB and the second PCB through the bus bar, rather than through wiring traces.

The invention further comprises a second bus bar which is also comprised of a conductive material and is secured to each of the first PCB and the second PCB to create an electrically conductive path along a length of the second bus bar between the circuitry and electronic components of the first PCB and the circuitry and electronic components of the second PCB. The bus bar is connected to a positive power terminal and the second bus bar is connected to ground. In exemplary embodiments, a third bus bar and a fourth bus bar are disposed in the system, each of the third and fourth bus bars also comprising a conductive material and being secured to each of the first PCB and the second PCB to create an electrically conductive path along a length of each of the third and fourth bus bars between the circuitry and electronic components of the first PCB and the circuitry and electronic components of the second PCB. In exemplary embodiments, the third bus bar is neutral and the fourth bus bar is connected to a second positive power terminal.

Each of the bus bar and the second bus bar comprise a plurality of fastener holes disposed in spaced relation along the length thereof for securing the bus bar and the second bus bar, respectively, to the PCB and for securing any electrical connectors to the bus bar. Nut and bolt fasteners are secured through selected ones of the fastener holes in each of the bus bar and the second bus bar and also through corresponding fastener holes in the first or second PCB's. A first ground lug is secured to an end of the bus bar and a second ground lug secured to an end of the second bus bar. Nut and bolt fasteners are used to secure the first and second ground lugs to respective ends of the bus bar and the second bus bar, with the bolts of each nut and bolt fastener extending through the fastener apertures closest to the end of each of the bus bar and the second bus bar.

The first and second ground lugs each comprise a block portion and a flange portion extending from the block portion, wherein the block portion comprises a fastener hole for securing the block portion to one of a power supply, ground, or a neutral point and the flange portion comprises a fastener hole for securing the flange portion to a PCB or to an end of the bus bar or the second bus bar.

In another aspect of the invention, there is provided a modular spa control system, which comprises a user interface having a housing, the housing comprising a bottom housing portion and a top housing portion, a PCB disposed in the housing, a display disposed on a top surface of the top housing portion, controls disposed on the top surface of the top housing portion, in proximity to the display, an interface mountable within a wall shell of a spa unit, so that the display and the controls are disposed on a top portion of the spa wall, and a pivot member rotatably supported within the wall shell and configured to support the top housing portion so that it may be pivoted between upright vertical or side orientations, for ready access by a user seated in the spa unit. The system may further comprise a connector and communication cables connecting the PCB and the user interface to one or more of a power supply, a remote control unit, and sensors for operation of the modular spa control system. A collar ring insert having O-rings disposed in O-ring grooves comprises a part of the system, the collar ring insert accommodating the connector and the pivot member and being arranged when installed in the wall shell to keep water from entering the housing.

In still another aspect of the invention, there is provided a modular spa control system which comprises a first printed circuit board (PCB) comprising circuitry and electronic components forming a part of the modular spa control system and a second PCB comprising circuitry and electronic components forming a different part of the modular spa control system. A bus bar, comprised of a conductive material and being secured to each of the first PCB and the second PCB, creates an electrically conductive path along a length of the bus bar between the circuitry and electronic components of the first PCB and the circuitry and electronic components of the second PCB, wherein electrical power is supplied to each of the first PCB and the second PCB through the bus bar. A user interface is provided, having a housing, the housing comprising a bottom housing portion and a top housing portion. At least one of the first PCB and the second PCB is disposed in the housing, and a display is disposed on a top surface of the top housing portion. Controls are disposed on the top surface of the top housing portion, in proximity to the display. An interface is mountable within a wall shell of a spa unit, so that the display and the controls are disposed on a top portion of the spa wall. Additionally, a pivot member is rotatably supported within the wall shell and configured to support the top housing portion so that it may be pivoted between upright vertical or side orientations, for ready access by a user seated in the spa unit.

A second bus bar, which is also comprised of a conductive material, is secured to each of the first PCB and the second PCB to create an electrically conductive path along a length of the second bus bar between the circuitry and electronic components of the first PCB and the circuitry and electronic components of the second PCB, wherein the bus bar is connected to a positive power terminal and the second bus bar is connected to ground. The system further comprises a third bus bar and a fourth bus bar, each of the third and fourth bus bars also comprising a conductive material and being secured to each of the first PCB and the second PCB to create an electrically conductive path along a length of each of the third and fourth bus bars between the circuitry and electronic components of the first PCB and the circuitry and electronic components of the second PCB, wherein the third bus bar is neutral and the fourth bus bar is connected to a second positive power terminal.

Each of the bus bar, the second bus bar, the third bus bar, and the fourth bus bar comprise a plurality of fastener holes disposed in spaced relation along the length thereof for securing the bus bar, the second bus bar, the third bus bar, and the fourth bus bar, respectively, to the PCB and for securing any electrical connectors to the bus bar. Nut and bolt fasteners are secured through selected ones of the fastener holes in each of the bus bar, the second bus bar, the third bus bar, and the fourth bus bar, and also through corresponding fastener holes in the first or second PCB's. A first ground lug is secured to an end of the bus bar, a second ground lug is secured to an end of the second bus bar, a third ground lug is secured to an end of the third bus bar, and a fourth ground lug is secured to an end of the fourth bus bar. Nut and bolt fasteners are used to secure the first, second, third, and fourth ground lugs to respective ends of the bus bar, the second bus bar, the third bus bar, and the fourth bus bar, with the bolts of each nut and bolt fastener extending through the fastener apertures closed to the end of each of the bus bar, the second bus bar, the third bus bar, and the fourth bus bar.

Advantageously, the first, second, third, and fourth ground lugs each comprise a block portion and a flange portion extending from the block portion, wherein the block portion comprises a fastener hole for securing the block portion to one of a power supply, ground, or a neutral point and the flange portion comprises a fastener hole for securing the flange portion to a PCB or to an end of the bus bar, the second bus bar, the third bus bar, or the fourth bus bar. A connector and communication cables connect the PCB and the user interface to one or more of a power supply, a remote control unit, and sensors for operation of the modular spa control system. A collar ring insert, having O-rings disposed in O-ring grooves, accommodates the connector and the pivot member and is arranged, when installed in the wall shell, to keep water from entering the housing.

The invention, together with additional features and advantages thereof, may best be understood by reference to the following description taken in conjunction with the accompanying illustrative drawing.

BRIEF DESCRIPTION OF THE DRAWINGS

FIG. 7 is an isometric view of a single terminal lug in isolation;

FIG. 8 is a side view of the single terminal lug shown in FIG. 7;

FIG. 9 is a top view of the single terminal lug shown in FIGS. 7 and 8;

FIG. 10 is a bottom view of the modular circuit board shown in FIG. 3.

DETAILED DESCRIPTION OF THE INVENTION

Figure 3:
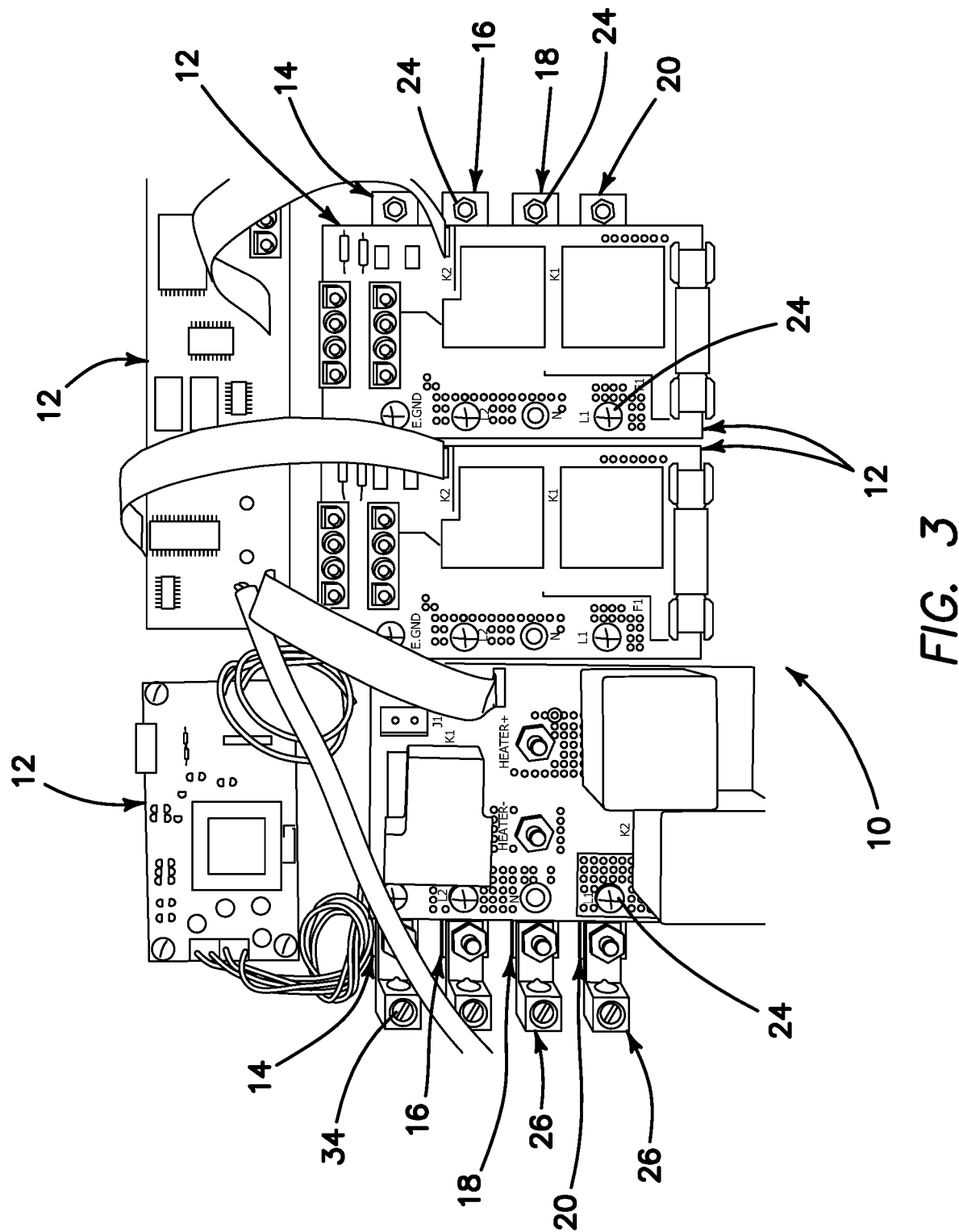
FIG. 3 is a top view of a modular circuit board for a spa control system utilizing power bus bars of the type shown in FIGS. 1 and 2, together with terminal lugs for connecting the circuit board to a power supply.
Figure 5:
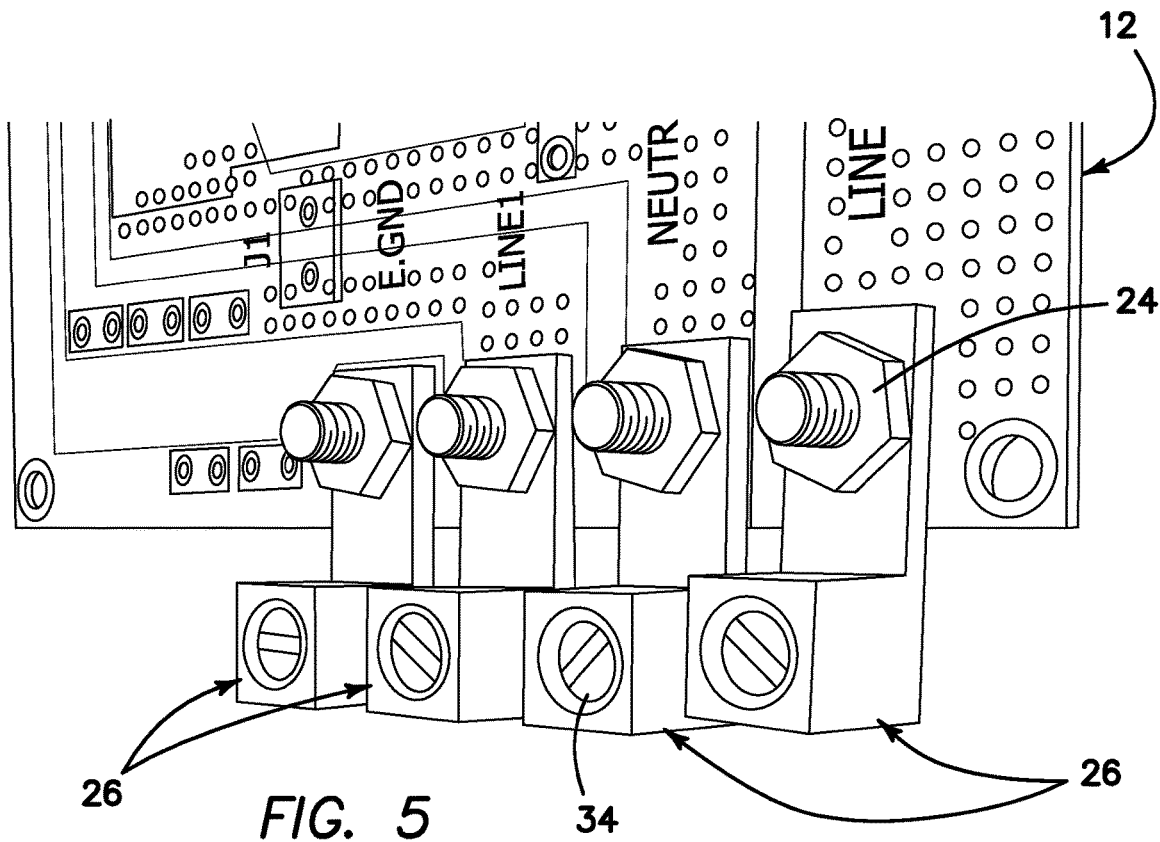
FIGS. 5 and 6 are views similar to FIG. 4.
Figure 6:
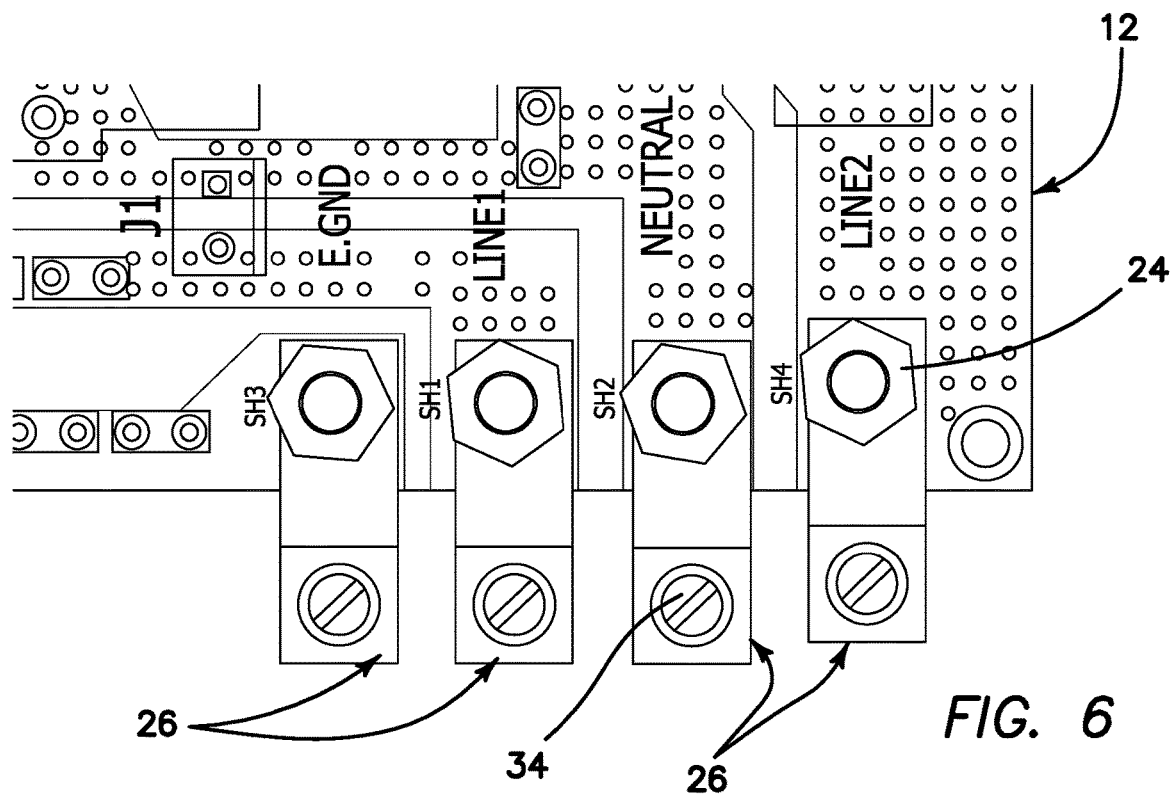

Referring now more particularly to the drawing figures, there is shown in FIG. 3 a modular assembled Printed Circuit Board (PCB) spa control system 10 constructed in accordance with principles of the present invention. The system 10 comprises a plurality of PCB's 12.

Figure 1:
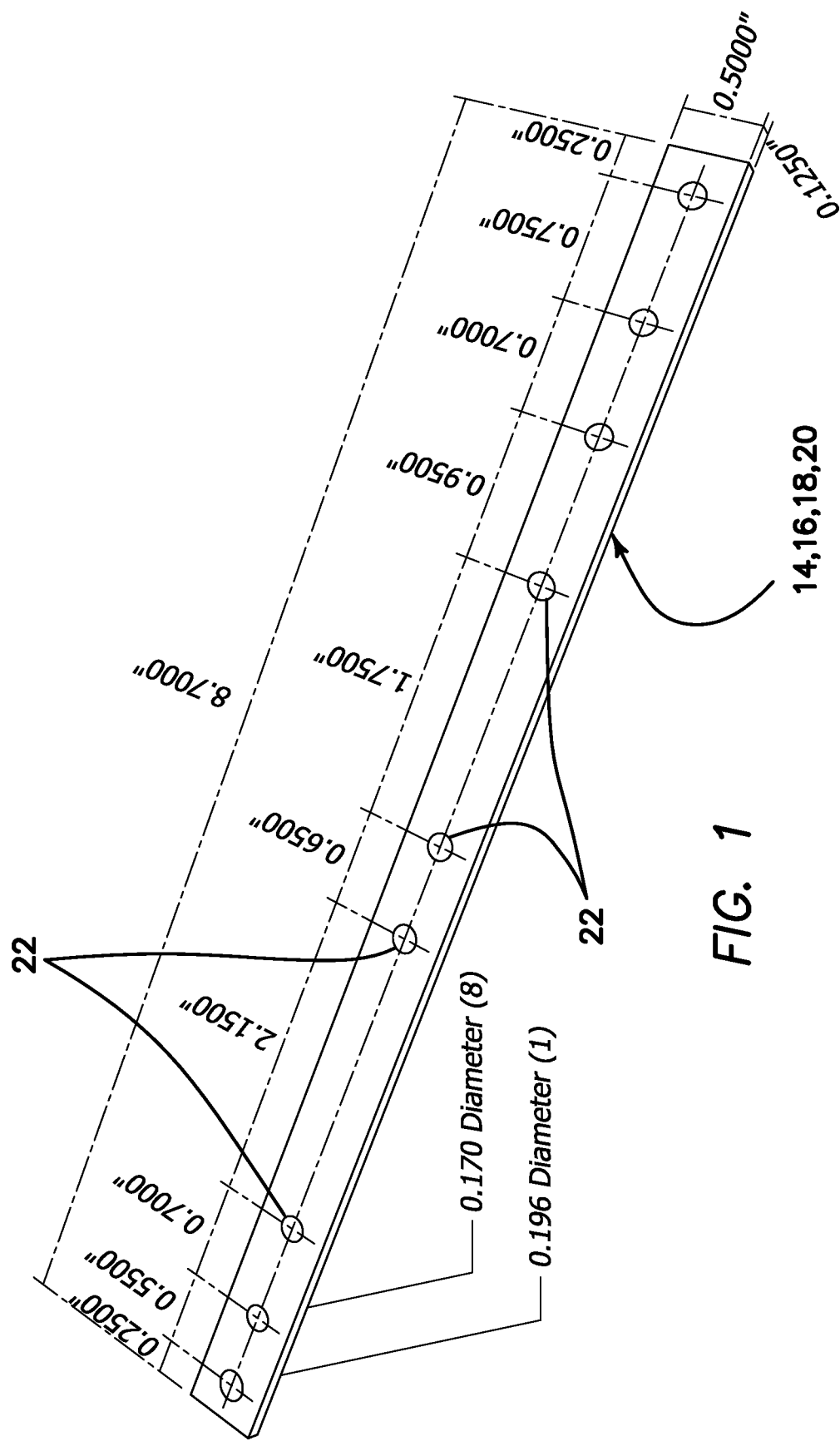
FIG. 1 is an isometric view of an exemplary power bus bar constructed in accordance with the principles of the present invention.
Figure 2:
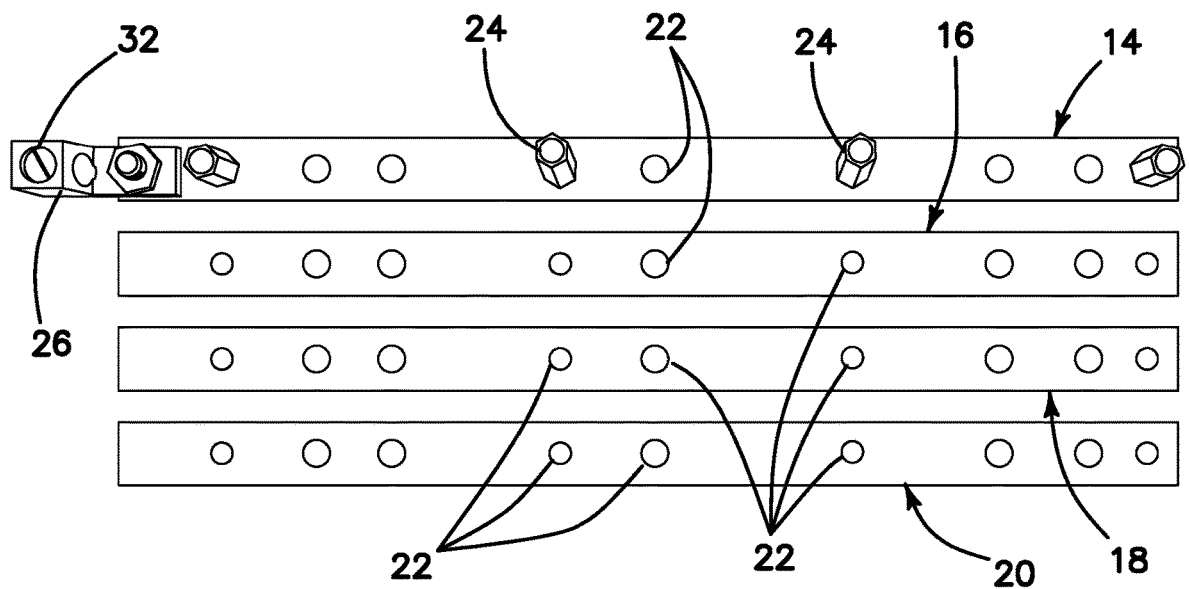
FIG. 2 is a top view of a plurality of power bus bars similar to those shown in FIG. 1.
Figure 4:
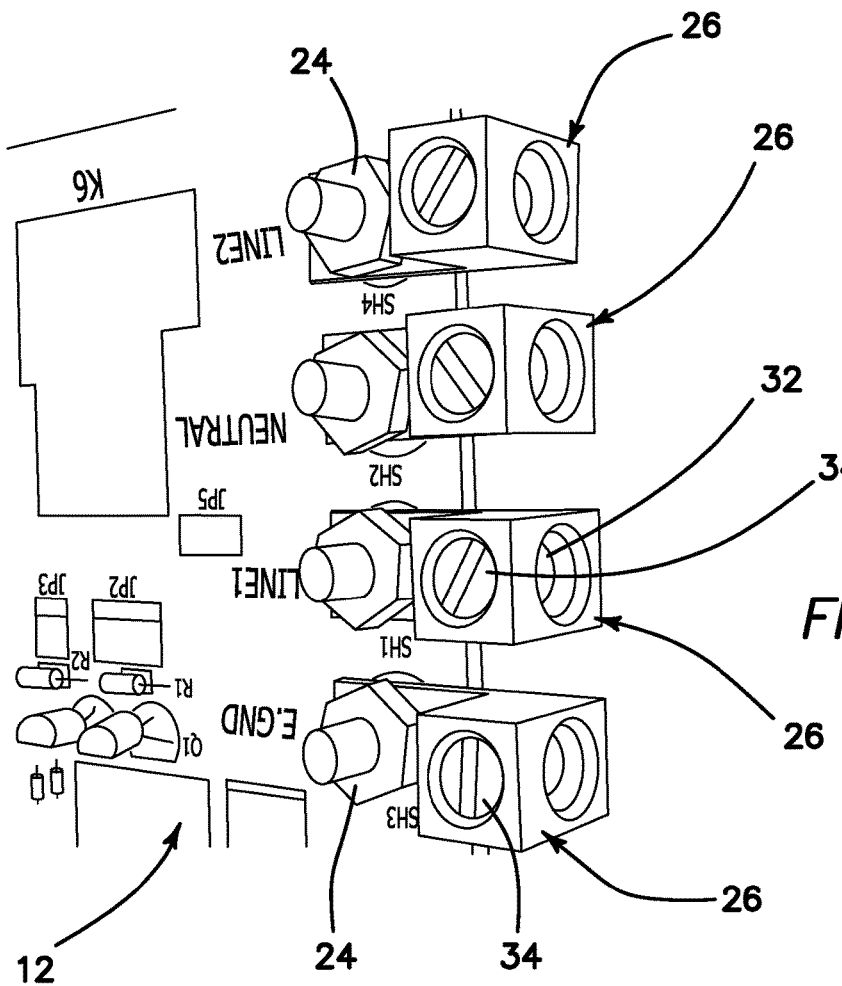
FIG. 4 is an isometric view of a circuit board illustrating terminal lugs for connecting the circuit board to a power supply.

Power is supplied to and managed by the system 10 through a plurality of bus bars 14, 16, 18, and 20, shown in FIGS. 3, 10, and also in FIGS. 1 and 2. Bus bars, of course, are known in the art of power supply and management, as they are often used in load management devices such as electrical circuit breaker panels for supplying and distributing power to the various circuits comprising the power supply system. However, they have not been used in power supply circuits such as the spa power supply circuits which are the subject of the present invention.

As noted above, the bus bars 14, 16, 18, 20 allow the connection of power to each of the modular circuit boards 10 without using wires or routing the trace to the relay or output connector. Thus, the inventive system advantageously solves the prior art problems of messy wires and an inability to route high voltage power to the relays or output connectors.

FIG. 1 illustrates a representative one of each of the four bus bars 14, 16, 18, 20, which are all preferably identical or substantially identical in construction. Each bus bar comprises a sturdy, high capacity electrically conductive metal, such as copper, brass, aluminum, and the like. They can be insulated and shielded to avoid inadvertent contact when necessary, but typically will not require this protection, since the circuitry itself is safely housed. Fastener holes 22 are provided in spaced relation along the length of each bus bar for securing the bus bar to the circuit board and any electrical connectors to the bus bar. For example, nut and bolt fasteners 24 are shown in FIGS. 1-4 for these purposes.

As illustrated, and noted above, four bus bars may be used in powering a typical spa control system 10. In the illustrated embodiment, bus bar 14 is the ground, bus bar 16 is Line 1, bus bar 18 is neutral, and bus bar 20 is Line 2. Each bus bar 14, 16, 18, 20 is connected at one end, using a nut and bolt fastener 24, to a single ground lug 26, which in turn is connected to the system power supply, ground, or a neutral point (and ultimately to ground).

The ground lug 26 is shown in isolation in FIGS. 7-9, and comprises a block portion 28 and flange portion 30. Each of the block portion 28 and flange portion 30 includes a fastener aperture 32 through which a fastener 24, 34 may be disposed. Fasteners 24 secure the flange portion 30 to the PCB 12 or to an end of one of the bus bars 14, 16, 18, or 20, while fasteners 34 secure the block portion 28 to the power supply, ground, or neutral point. Advantageously, using a single ground lug 26 for each power line reduces cost significantly per controller system 10.

The simple bus bar system described herein allows for a convenient modular system easily convertible, for example, from 240V to 120V.

Figure 11:
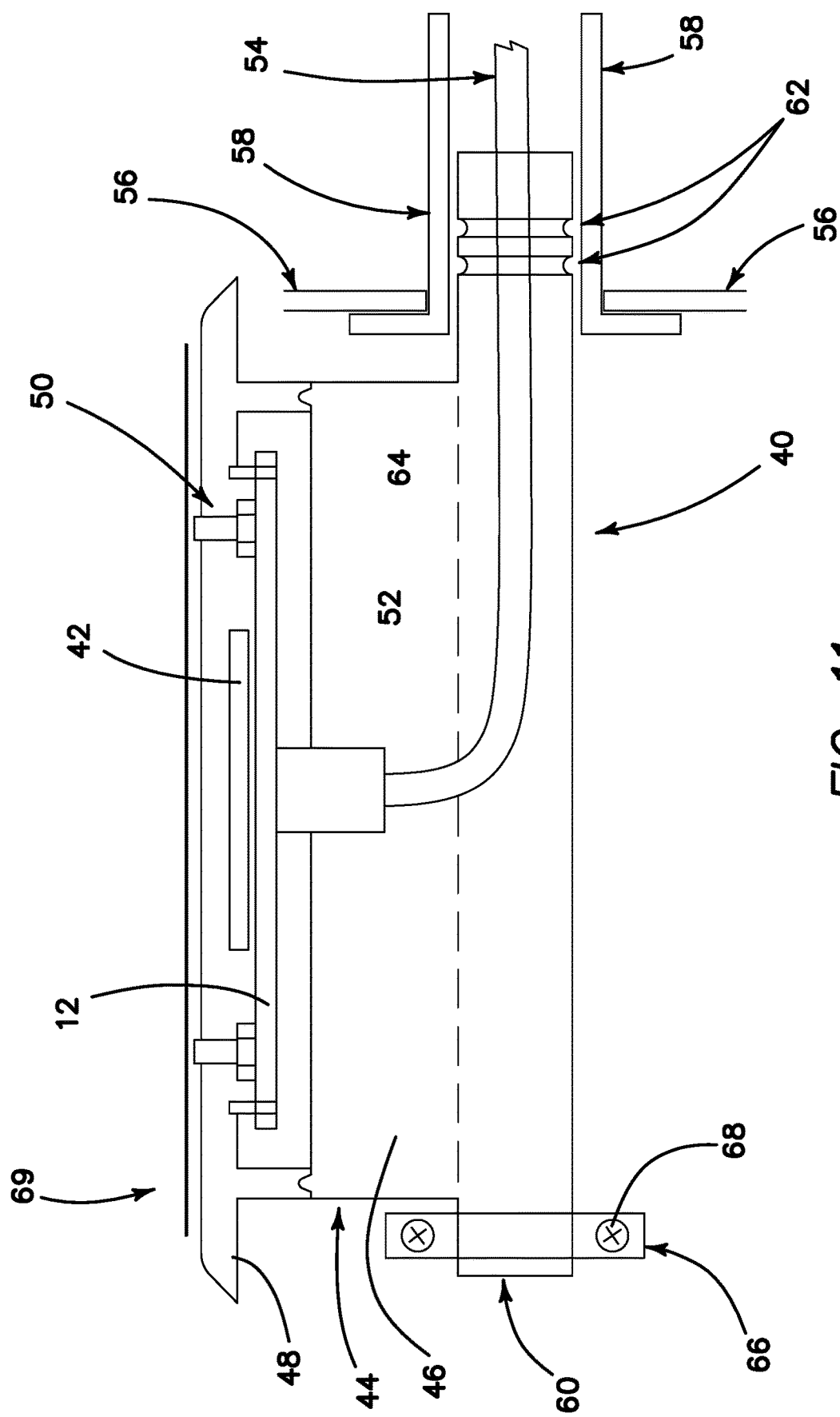
FIG. 11 is a schematic view of a pivotable or swivelable user interface panel for a spa control system.

FIG. 11 illustrates another advantageous feature of the present invention, which is a swivelable user interface 40. The interface 40 comprises, in an exemplary illustrated embodiment, a PCB 12 and a display, such as a Liquid Crystal Diode (LCD) display 42. The PCB 12 and LCD display 42 are disposed in a housing 44, which may comprise a bottom plastic housing portion 46 and a top plastic housing portion 48. Control switches 50 are disposed on a top surface of the top plastic housing portion 48, in proximity to the display 42, for ready access by the user.

A connector 52 and communication cables 54 connect the PCB and user interface to a power supply, remote control unit, sensors and the like, as required for operation of the system 40.

The interface 40 is mounted within a wall shell 56 of a spa, so that the LCD display 42 and switches 50 are disposed on a top portion of the spa wall. A collar ring insert 58 accommodates the connector 52 and a pivot member 60, as illustrated, with O-rings 62 disposed in O-ring grooves 64 to keep water from entering the housing 44. A mechanism 66 to hold the user interface is secured with a fastener 68, preferably a stainless steel screw, in a manner which permits the pivot member 60 to swivel to an upright or side orientation, so that the LCD display 42 and switches 50 are also swiveled to a vertical, upright or side orientation, for ready access by a user seated in the spa. A custom graphic overlay 69 is disposed on the top plastic housing portion 48.

Accordingly, although an exemplary embodiment and method according to the invention have been shown and described, it is to be understood that all the terms used herein are descriptive rather than limiting, and that many changes, modifications, and substitutions may be made by one having ordinary skill in the art without departing from the spirit and scope of the invention.

What is claimed is:

1. A modular spa control system comprising:
   a first printed circuit board (PCB) comprising circuitry and electronic components forming a part of the modular spa control system;
   a second PCB comprising circuitry and electronic components forming a different part of the modular spa control system;
   a bus bar comprised of a conductive material and being secured to each of the first PCB and the second PCB to create an electrically conductive path along a length of the bus bar between the circuitry and electronic components of the first PCB and the circuitry and electronic components of the second PCB;
   a second bus bar which is also comprised of a conductive material and is secured to each of the first PCB and the second PCB to create an electrically conductive path along a length of the second bus bar between the circuitry and electronic components of the first PCB and the circuitry and electronic components of the second PCB, wherein the bus bar is connected to a positive power terminal and the second bus bar is connected to ground;
   each of the bus bar and the second bus bar comprising a plurality of fastener holes disposed in spaced relation along the length thereof for securing the bus bar and the second bus bar, respectively, to the PCB and for securing any electrical connectors to the bus bar;
   a first set of nut and bolt fasteners, each comprising a nut and a bolt, secured through selected ones of the fastener holes in each of the bus bar and the second bus bar and also through corresponding fastener holes in the first or second PCB's;
   a first ground lug secured to an end of the bus bar and a second ground lug secured to an end of the second bus bar;
   a second set of nut and bolt fasteners, each comprising a nut and a bolt, securing the first and second ground lugs to respective ends of the bus bar and the second bus bar, with the bolts of each nut and bolt fastener in the second set of nut and bolt fasteners extending through the fastener holes closest to the end of each of the bus bar and the second bus bar;
   wherein electrical power is supplied to each of the first PCB and the second PCB through the bus bar.

2. The modular spa control system as recited in claim 1, and further comprising a third bus bar and a fourth bus bar, each of the third and fourth bus bars also comprising a conductive material and being secured to each of the first PCB and the second PCB to create an electrically conductive path along a length of each of the third and fourth bus bars between the circuitry and electronic components of the first PCB and the circuitry and electronic components of the second PCB, wherein the third bus bar is neutral and the fourth bus bar is connected to a second positive power terminal.

3. The modular spa control as recited in claim 1, wherein the first and second ground lugs each comprise a block portion and a flange portion extending from the block portion, wherein the block portion comprises a fastener hole for securing the block portion to one of a power supply, ground, or a neutral point and the flange portion comprises a fastener hole for securing the flange portion to a PCB or to an end of the bus bar or the second bus bar.

4. The modular spa control system as recited in claim 1, and further comprising:
   a user interface having a housing, the housing comprising a bottom housing portion and a top housing portion;
   a PCB disposed in the housing;
   a display disposed on a top surface of the top housing portion;
   controls disposed on the top surface of the top housing portion, in proximity to the display;
   an interface mountable within a wall shell of a spa unit, so that the display and the controls are disposed on a top portion of the spa wall; and
   a pivot member rotatably supported within the wall shell and configured to support the top housing portion so that it may be pivoted between upright vertical or side orientations, for ready access by a user seated in the spa unit.

5. The modular spa control system as recited in claim 4, and further comprising a connector and communication cables connecting the PCB and the user interface to one or more of a power supply, a remote control unit, and sensors for operation of the modular spa control system.

6. The modular spa control system as recited in claim 5, and further comprising a collar ring insert having O-rings disposed in O-ring grooves, the collar ring insert accommodating the connector and the pivot member and being arranged when installed in the wall shell to keep water from entering the housing.

\* \* \* \* \*